United States Patent

Yoshihara et al.

[11] Patent Number: 5,763,328
[45] Date of Patent: Jun. 9, 1998

[54] ASHING METHOD

[75] Inventors: Syuuichi Yoshihara; Junichi Taniguchi, both of Nagasaki, Japan

[73] Assignee: Sony Corporation, Japan

[21] Appl. No.: 638,712

[22] Filed: Apr. 29, 1996

[30] Foreign Application Priority Data

May 9, 1995 [JP] Japan ................. 7-135849

[51] Int. Cl.$^6$ ................. H01L 21/306
[52] U.S. Cl. ................. 438/725; 438/726; 216/69
[58] Field of Search ................. 216/69; 156/643.1, 156/646.1, 659.11

[56] References Cited

U.S. PATENT DOCUMENTS

| | | | |
|---|---|---|---|
| 5,174,816 | 12/1992 | Aoyama et al. | 106/203 |
| 5,227,341 | 7/1993 | Kamide et al. | 437/229 |
| 5,320,707 | 6/1994 | Kanekiyo et al. | 156/665 |
| 5,578,163 | 11/1996 | Yachi | 156/643.1 |

*Primary Examiner*—R. Bruce Breneman
*Assistant Examiner*—Michael E. Adjodha
*Attorney, Agent, or Firm*—Ronald P. Kananen

[57] ABSTRACT

In an ashing method for ashing a wafer having an aluminum wiring layer etched by a chlorine containing gas, the wafer is ashed under the conditions that a mixture gas composed of an oxygen gas and at least one kind of alcohol gas selected from $CH_3OH$, $C_2H_5OH$, $n-C_3H_7OH$, and $i-C_3H_7OH$ is used as an ashing gas, a flow ratio between the alcohol gas and the oxygen gas is set in the range of 1:1 to 1:5, pressure in an ashing chamber is set to 200 Pa or more, and temperature in the ashing chamber is set in the range of 200° C. to 270° C. Accordingly, corrosion in the aluminum wiring layer due to a residual component of the chloride containing gas in a photoresist film can be prevented.

8 Claims, 2 Drawing Sheets

ASHING METHOD

BACKGROUND OF THE INVENTION

The present invention relates to an ashing method in subjecting to an ashing process a wafer whose aluminum wiring layer has been etched by a chlorine containing gas, by using an ashing device in-line connected with an etching device, and more particularly to an ashing method intended to prevent the occurrence of corrosion in the aluminum wiring layer in the next process step.

In patterning an aluminum wiring layer, a wafer having the aluminum wiring layer is first subjected to a plasma etching process using a chlorine containing gas by a plasma etching device, and is next subjected to a plasma ashing process by using a plasma ashing device in-line connected with the plasma etching device, thus removing photoresist in a dry condition.

More specifically, as shown in FIG. 1, a plasma etching device 10 and a plasma ashing device 20 (a portion surrounded by a two-dot and dash line) are in-line connected together to continuously perform the plasma etching process and the plasma ashing process. That is, the system shown in FIG. 1 includes the plasma etching device 10 and the plasma ashing device 20 in-line connected together, and has a configuration such that in feeding a wafer from the plasma etching device 10 to the plasma ashing device 20, the wafer is prevented from coming into contact with the atmospheric air.

The plasma etching device 10 is a microwave plasma etching device, in which an etching gas 31 is supplied into an etching chamber 14 defined by a bell jar 12, and a microwave generated from a magnetron 16 is introduced under the supply of the etching gas 31 to generate a plasma in the etching chamber 14, thereby etching a wafer placed on an electrode 18.

The plasma ashing device 20 is a microwave plasma etching device, in which an ashing gas 33 is supplied into an ashing chamber 24 defined by a bell jar 22, and a microwave generated from a magnetron 26 is introduced under the supply of the ashing gas 33 to generate a plasma in the ashing chamber 24, thereby ashing a wafer placed on an electrode 28.

The plasma etching device 10 and the plasma ashing device 20 are in-line connected together by a feed line 30, and the wafer is fed from the plasma etching device 10 to the plasma ashing device 20 by means of a feed robot 32 provided in the feed line 30. The etching chamber 14, the feed line 30, and the ashing chamber 24 are all evacuated to be maintained at a given vacuum by a vacuum pump.

The wafer having an aluminum wiring layer formed on a substrate surface in the previous process step is etched for the purpose of patterning of the aluminum wiring layer in the plasma etching device 10 by using a chlorine containing gas as the etching gas 31. The wafer is next ashed for the purpose of removal of photoresist in the plasma ashing device 20 by using an oxygen gas or by using a mixture gas composed of an oxygen gas and a methanol gas as the ashing gas 33.

The ashing process in related art is carried out under the conditions that the pressure in the ashing chamber 24 is set in the range of 0.8 Torr to 1.0 Torr, the mixing ratio between the oxygen gas and the methanol gas is set to about 5:1, and the ashing time per wafer is set to about 80 seconds.

However, in many cases of a related art ashing method, as shown in FIG. 2a, a photoresist 42 for patterning of an aluminum wiring layer is not completely removed, but resides like a sidewall on the sidewall of the aluminum wiring layer 41, so that a chlorine containing gas used for etching is contained in the residual photoresist 42. In this example shown in FIG. 2a, a TiON layer 43 is formed on the upper surface of the aluminum wiring layer (Al—Si layer) 41, and a Ti layer 44 is formed on the lower surface of the aluminum wiring layer 41. During the feed of the wafer stored in an unload cassette, for example, from the ashing device to the next process device, the chlorine containing gas contained in the residual photoresist 42 chemically reacts with the moisture in the atmosphere to electrochemically corrode the aluminum wiring layer 41, thus often causing a corrosion pit 45 as shown in FIG. 2b, which is a problem in quality control of a semiconductor device.

This phenomenon depends also on the environmental atmosphere surrounding semiconductor device production facilities, the weather, etc. In particular, this phenomenon is remarkable when the humidity of the atmosphere is high.

SUMMARY OF THE INVENTION

It is accordingly an object of the present invention to provide an ashing method which can remove the chlorine containing gas used in the etching process, in the ashing process, to thereby prevent the occurrence of corrosion in the aluminum wiring layer in the next process step.

According to a first aspect of the present invention, there is provided an ashing method for ashing a wafer having an aluminum wiring layer etched by a chlorine containing gas, by using a plasma ashing device in-line connected with a plasma etching device, wherein the wafer is ashed under the conditions that a mixture gas composed of an oxygen gas and at least one kind of alcohol gas selected from $CH_3OH$, $C_2H_5OH$, n—$C_3H_7OH$, and i—$C_3H_7OH$ is used as an ashing gas, a flow ratio between the alcohol gas and the oxygen gas is set in the range of 1:2 to 1:5, pressure in an ashing chamber is set to 200 Pa (1.5 Torr) or more, and temperature in the ashing chamber is set in the range of 200° C. to 270° C.

The alcohol gas to be selected is preferably a methanol gas. The pressure is set to preferably 210 Pa (1.6 Torr) or more. Further, the time required for ashing may be the same as the usual ashing time that is normally about 90 seconds. The method according to the first aspect of the present invention is based on the results of Examples 1 to 5 to be hereinafter described. The reason for setting the flow ratio of the oxygen gas to the alcohol gas to 2 or more is such that if the flow ratio of the oxygen gas to the alcohol gas is set to less than 2, the removability of a resist film is reduced.

The chlorine containing gas used in the etching process is selected from $CCl_4$, $CCl_4+Cl_2$, $SiCl_4$, $BCl_3$, etc. Further, the aluminum wiring layer is formed of not only aluminum, but also aluminum alloy such as Al+Si.

According to a second aspect of the present invention, there is provided an ashing method for ashing a wafer having an aluminum wiring layer etched by a chlorine containing gas, by using a plasma ashing device in-line connected with a plasma etching device, comprising a first ashing step wherein the wafer is ashed under the conditions that a mixture gas composed of an oxygen gas and at least one kind of alcohol gas selected from $CH_3OH$, $C_2H_5OH$, n—$C_3H_7OH$, and i—$C_3H_7OH$ is used as an ashing gas, a flow ratio between the alcohol gas and the oxygen gas is set in the range of 1:2.5 to 1:10, pressure in an ashing chamber is set to 200 Pa (1.5 Torr) or less, and temperature in the ashing chamber is set in the range of 200° C. to 270° C.; and a second ashing step wherein the wafer is next ashed under the conditions that a flow ratio of the alcohol gas to the oxygen gas is set to 0.5 or more, pressure in the ashing chamber is set to 200 Pa (1.5 Torr) or more, temperature in the ashing chamber is set in the range of 200° C. to 270° C., and an ashing time is set to at least 10 seconds.

The method according to the second aspect of the present invention is based on the results of Examples 9 to 11 to be hereinafter described. When the flow ratio between the alcohol gas and the oxygen gas becomes 1:2.5 or near in the first ashing step, photoresist is slightly left; however, it can be enough removed in the second ashing step.

The first ashing step is intended to mainly remove a photoresist film, and the second ashing step is intended to mainly remove a chlorine containing gas. The alcohol gas to be selected is preferably a methanol gas. Further, the pressure in the second ashing step is set to preferably 210 Pa (1.6 Torr) or more.

According to a third aspect of the present invention, there is provided an ashing method for ashing a wafer having an aluminum wiring layer etched by a chlorine containing gas, by using a plasma ashing device in-line connected with a plasma etching device, wherein the wafer is ashed under the conditions that a mixture gas composed of an oxygen gas and at least one kind of alcohol gas selected from $CH_3OH$, $C_2H_5OH$, n—$C_3H_7OH$, and i—$C_3H_7OH$ is used as an ashing gas, a flow ratio of the alcohol gas to the oxygen gas is set to 0.5 or more, pressure in an ashing chamber is set to 200 Pa (1.5 Torr) or less, and temperature in the ashing chamber is set in the range of 200° C. to 270° C.

The method according to the third aspect of the present invention has been achieved by finding the fact that a residual chlorine containing gas can be removed by increasing the flow ratio of the alcohol gas to the oxygen gas even under the pressure in the ashing chamber set to 200 Pa (1.5 Torr) or less. The alcohol gas to be selected is preferably a methanol gas.

DETAILED DESCRIPTION OF THE PREFERRED EMBODIMENTS

The present inventors have noticed the fact that the partial pressure of a methanol gas is increased by increasing the pressure in an ashing chamber of a plasma ashing device. As a result, the number of molecules of the methanol gas in the ashing chamber is increased to increase the probability of collision between the molecules of the methanol gas and electrons and also generate a large number of radicals. The present inventors have considered that the radicals react with a residual chlorine containing gas to realize the removal of the residual chlorine containing gas, and have made the following examples on the basis of the above consideration.

EXAMPLE 1

Figure 1:
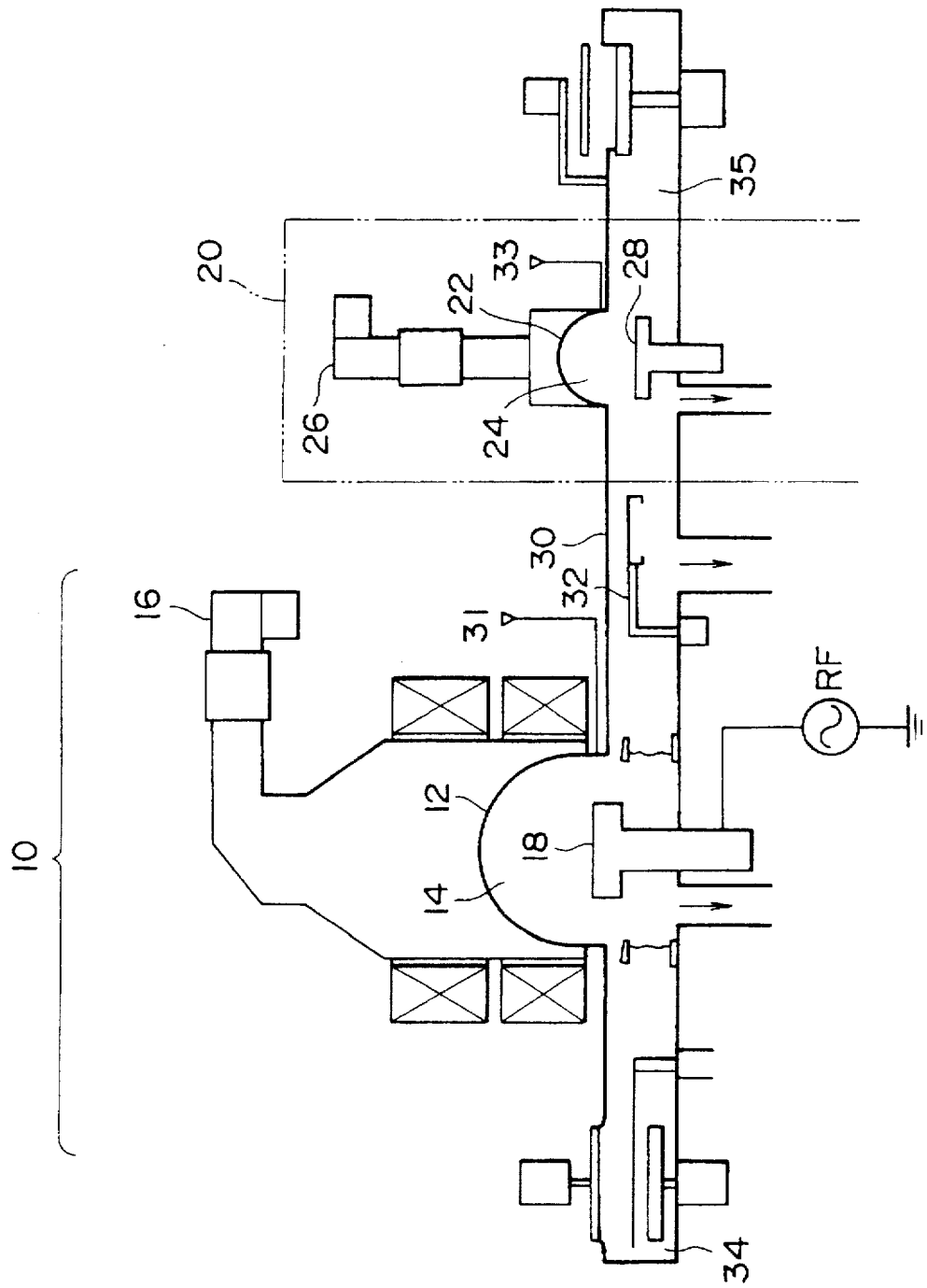
FIG. 1 is a schematic illustration of a plasma etching device and a plasma ashing device in-line connected together.
Figure 2A:
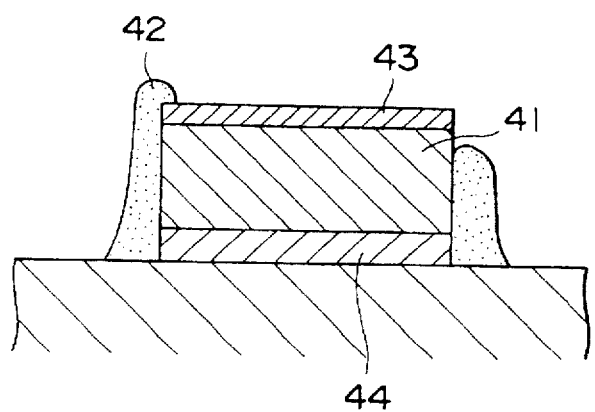
FIG. 2a is a schematic sectional view illustrating a condition that photoresist resides on an aluminum wiring layer.
Figure 2B:
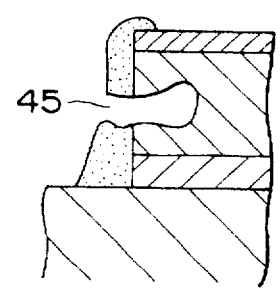
FIG. 2b is a schematic sectional view illustrating a condition that the aluminum wiring layer is corroded.

1) A wafer having an aluminum wiring layer (Al: 99%–Si: 1%) formed on a substrate surface was etched by using the plasma etching device shown in FIG. 1 under the following conditions to prepare a sample wafer for the next ashing process.

Etching Conditions
Pressure: 2.1 Pa (16 mTorr)
Stage Temperature: 25° C.
RF Power: 50 W
Gas Flow: $BCl_3$: 90 sccm/$Cl_2$: 60 sccm
Anode Current: 300 mA 2) The sample wafer was next ashed by using the plasma ashing device shown in FIG. 1 under the following conditions.

Ashing Conditions
Pressure: 133 Pa (1.0 Torr)
Stage Temperature: 250° C.
Gas Flow: $O_2$: 300 sccm/$CH_3OH$: 60 sccm
Anode Current: 420 mA 3) The corrosion condition of the sample wafer was observed just after the ashing process and after allowing the sample wafer to stand in a thermostat at a temperature of 23° C. and a humidity of 60% for 2 hours, 4 hours, and 24 hours. The results are shown in Table 1 at Example 1. The ashing time shown in Table 1 is a time period required to ash away a photoresist film having a thickness of about 2.2 μm.

TABLE 1

| Example | | 1 | 2 | 3 | 4 | 5 |
|---|---|---|---|---|---|---|
| Pressure (Torr) | | 1.0 | 1.3 | 1.6 | 1.9 | 2.2 |
| Ashing Time (sec) | | 84 | 84 | 90 | 100 | 115 |
| Corrosion Condition of Sample Number of Corrosion Pits/Number of Corroded Chips | Just After Ashing | 0/0 | 0/0 | 0/0 | 0/0 | 0/0 |
| | After 2 Hours | 3/2 | 3/1 | 0/0 | 0/0 | 0/0 |
| | After 4 Hours | 26/5 | 7/3 | 0/0 | 0/0 | 0/0 |
| | After 24 Hours | 26/5 | 7/3 | 0/0 | 0/0 | 0/0 |
| Evaluation | | X | X | ○ | ○ | ○ |

In Example 1 to Example 3, the corrosion condition is represented by the ratio of the number of corrosion pits per wafer/the number of corroded chips per wafer. For example, in the sample wafer after allowed to stand for 2 hours in Example 1, the number of corrosion pits per wafer is 3, and the number of corroded chips per wafer is 2. Further, symbol ○ represents an allowable condition, and symbol x represents an unallowable condition.

EXAMPLES 2 TO 5

The sample wafer obtained by performing the etching process under the same conditions as those in Example 1 was subjected to the ashing process under the same conditions as those in Example 1 with the exception that the pressure of the ashing conditions was raised to 173 Pa (1.3 Torr), 213 Pa (1.6 Torr), 257 Pa (1.9 Torr), and 293 Pa (2.2 Torr). Then, the corrosion condition of the sample wafer was observed like Example 1. The results are shown in Table 1 at Examples 2 to 5.

As apparent from Table 1, when the ashing process was carried out under the pressure of 1.6 Torr or more, the aluminum wiring layer of the sample wafer was not corroded even after allowed to stand for 24 hours.

EXAMPLE 6

The present inventors considered that corrosion of the aluminum wiring layer could be prevented by oxidizing the surface of the aluminum wiring layer to obtain a passive state of aluminum, and then tested after-treatment by an oxygen gas. After preparing a sample wafer under the same etching conditions and ashing conditions as those in Example 1, after-treatment of the sample wafer was carried out by using an oxygen gas only under the following conditions. It is to be noted that the sample wafer subjected to the after-treatment is the same as that obtained in Example 1, so that the result of evaluation to this sample wafer is x.

After-treatment Conditions
Pressure: 133 Pa (1.0 Torr)
Stage Temperature: 250° C.
Gas Flow: $O_2$: 360 sccm
Anode Current: 420 mA
Treatment Time: 30 sec The corrosion condition of the sample wafer was observed just after the after-treatment process and after allowing the sample wafer to stand in a thermostat at a temperature of 23° C. and a humidity of 60% for 2 hours, 4 hours, and 24 hours. The results are shown in Table 2 at Example 6.

TABLE 2

| Example | | 6 | 7 | 8 |
| --- | --- | --- | --- | --- |
| Pressure (Torr) | | 1.0 | 1.3 | 1.4 |
| Corrosion Condition of Sample Number of Corrosion Pits/Number of Corroded Chips | Just After Ashing | 0/0 | 0/0 | 0/0 |
| | After 2 Hours | 22/5 | 3/2 | 4/4 |
| | After 4 Hours | 26/5 | 3/2 | 5/5 |
| | After 24 Hours | 26/5 | 3/2 | 5/5 |
| Evaluation | | X | X | X |

EXAMPLES 7 AND 8

An after-treatment process was carried out under the same conditions as those in Example 6 with the exception that the pressure of the after-treatment (ashing) conditions was raised to 173 Pa (1.3 Torr) and 213 Pa (1.6 Torr). Then, the corrosion condition of the sample wafer was observed like Example 6. The results are shown in Table 2 at Examples 7 and 8.

As apparent from Table 2, the corrosion could not be prevented by the after-treatment using an oxygen gas only.

EXAMPLE 9

1) The sample wafer obtained under the same etching conditions as those in Example 1 was subjected to an ashing process under the following conditions by using the plasma ashing device shown in FIG. 1.

Ashing Conditions
Pressure: 133 Pa (1.0 Torr)
Gas Flow: $O_2$: 300 sccm/$CH_3OH$: 60 sccm
Anode Current: 420 mA
Ashing Time: 84 sec 2) An after-treatment process was next carried under the following conditions.

After-treatment Conditions
Pressure: 213 Pa (1.6 Torr)
Stage Temperature: 250° C.
Gas Flow: $O_2$: 80 sccm/$CH_3OH$: 80 sccm
Anode Current: 420 mA
Treatment Time: 10 sec The corrosion condition of the sample wafer was observed just after the after-treatment process and after allowing the sample wafer to stand in a thermostat at a temperature of 23° C. and a humidity of 60% for 2 hours, 4 hours, and 24 hours. The results are shown in Table 3 at Example 9.

TABLE 3

| Example | | 9 | 10 | 11 |
| --- | --- | --- | --- | --- |
| Ashing Time (sec) | | 10 | 20 | 30 |
| Corrosion Condition of Sample Number of Corrosion Pits/Number of Corroded Chips | Just After Ashing | 0/0 | 0/0 | 0/0 |
| | After 2 Hours | 0/0 | 0/0 | 0/0 |
| | After 4 Hours | 0/0 | 0/0 | 0/0 |
| | After 24 Hours | 0/0 | 0/0 | 0/0 |
| Evaluation | | ○ | ○ | ○ |

EXAMPLES 10 AND 11

An after-treatment process was carried out under the same conditions as those in Example 9 with the exception that the after-treatment time was increased to 20 sec and 30 sec. Then, the corrosion condition of the sample wafer was observed like Example 9. The results are shown in Table 3 at Examples 10 and 11.

As apparent from the results of Examples 6 to 11, the corrosion cannot be prevented by the after-treatment process using an oxygen gas only, but the corrosion can be prevented by the after-treatment process using a mixture gas composed of an oxygen gas and a methanol gas.

The present invention will now be described in more detail on the basis of the following example.

The following example is an example of the present invention applied to an ashing process in an actual production line for semiconductor devices.

A wafer having an aluminum wiring layer (Al: 99%—Si: 1%) formed on a substrate surface was etched by using the plasma etching device shown in FIG. 1 under the following conditions. The wafer thus etched was next subjected to a two-stage ashing process by using the plasma ashing device shown in FIG. 1 under the following conditions.

1) Etching Conditions
Pressure: 2.1 Pa (16 mTorr)
Stage Temperature: 25° C.
RF Power: 50 W
Gas Flow: $BCl_3$: 90 sccm/$Cl_2$: 60 sccm
Anode Current: 300 mA 2) First-stage Ashing Conditions
Pressure: 253 Pa (1.9 Torr)
Stage Temperature: 250° C.
Gas Flow: $O_2$: 300 sccm/$CH_3OH$: 60 sccm
Anode Current: 420 mA
Ashing Time: 100 sec 3) Second-stage Ashing Conditions
Pressure: 213 Pa (1.6 Torr)
Stage Temperature: 250° C.
Gas Flow: $O_2$: 80 sccm/$CH_3OH$: 80 sccm
Anode Current: 420 mA
Ashing Time: 20 sec The result of application of the method of the present invention to the production line in an industrial scale shows that by the ashing process in the related art method adopted until June in a certain year, corrosion occurred on many wafers and the number of occurrences of corrosion was large every month, particularly in April and June showing a high humidity, whereas no corrosion occurred according to the method of the present invention adopted in July and later. Thus, the effectiveness of the method of the present invention applied in an industrial scale has been demonstrated.

According to the method of the present invention, the corrosion can be enough prevented only by the single-stage ashing process as in Example 1. However, in applying the present invention to an actual production line, the corrosion can be more effectively prevented by the combination of the first-stage ashing process and the second-stage ashing process as mentioned above. The first-stage ashing process is intended to mainly remove photoresist, and the second-stage ashing process is intended to mainly remove a residual chlorine containing gas. In addition, even if the second-stage ashing process is carried out for an excess time, photoresist may possibly reside because of a low ashing rate.

According to the present invention, in ashing a wafer having an aluminum wiring layer etched by a chlorine containing gas, by using a plasma ashing device in-line connected with a plasma etching device; a mixture gas composed of an oxygen gas and at least one kind of alcohol gas selected from $CH_3OH$, $C_2H_5OH$, n—$C_3H_7OH$, and i—$C_3H_7OH$ is used as an ashing gas, and (1) the ashing is carried out under the conditions that the flow ratio between the alcohol gas and the oxygen gas is set in the range of 1:1 to 1:5, the pressure in the ashing chamber is set to 200 Pa (1.5 Torr) or more, and the temperature in the ashing chamber is set in the range of 200° C. to 270° C.; or (2) the first stage of ashing is carried out under the conditions that the flow ratio between the alcohol gas and the oxygen gas is set in the range of 1:2.5 to 1:5, the pressure in the ashing chamber is set to 200 Pa (1.5 Torr) or less, and the temperature in the ashing chamber is set in the range of 200° C. to 270° C., and the second stage of ashing is next carried out under the conditions that the flow ratio of the alcohol gas to the oxygen gas is set to 0.5 or more, the pressure in the ashing chamber is set to 200 Pa (1.5 Torr) or more, and the temperature in the ashing chamber is set in the range of 200° C. to 270° C.; or (3) the ashing is carried out under the conditions that the flow ratio of the alcohol gas to the oxygen gas is set to 0.6 or more, the pressure in the ashing chamber is set to 200 Pa (1.5 Torr) or less, and the temperature in the ashing chamber is set in the range of 200° C. to 270° C.

Accordingly, the chlorine containing gas residing in a photoresist film deposited to the aluminum wiring layer can be removed to thereby prevent the occurrence of corrosion in the aluminum wiring layer of the wafer in the next process step.

What is claimed is:

1. An ashing method for ashing a wafer having a wiring layer etched by a chlorine containing gas, by using a plasma ashing device;

wherein said wafer is ashed under the conditions that a mixture gas composed of an oxygen gas and at least one kind of alcohol gas selected from $CH_3OH$, $C_2H_5OH$, n—$C_3H_7OH$, and i—$C_3H_7OH$ is used as an ashing gas, a flow ratio between said alcohol gas and said oxygen gas is set in the range of 1:2 to 1:5, pressure in an ashing chamber is set to 200 Pa (1.5 Torr) or more, and temperature in said ashing chamber is set in the range of 200° C. to 270° C.

2. An ashing method according to claim 1, wherein said alcohol gas is a methanol gas.

3. An ashing method according to claim 1, wherein said wiring layer is formed of Al or Al alloy.

4. An ashing method according to claim 1, wherein said chlorine containing gas is at least one kind of gas selected from $CCl_4$, $CCl_4+Cl_2$, $SiCl_4$, and $BCl_3$.

5. An ashing method for ashing a wafer having an aluminum containing wiring layer etched by a chlorine containing gas, by using a plasma ashing device, comprising:

a first ashing step wherein said wafer is ashed under the conditions that a mixture gas composed of an oxygen gas and at least one kind of alcohol gas selected from $CH_3OH$, $C_2H_5OH$, n—$C_3H_7OH$, and i—$C_3H_7OH$ is used as an ashing gas, a flow ratio between said alcohol gas and said oxygen gas is set in the range of 1:2.5 to 1:10, pressure in an ashing chamber is set to 200 Pa (1.5 Torr) or less, and temperature in said ashing chamber is set in the range of 200° C. to 270° C.; and a second ashing step wherein said wafer is next ashed under the conditions that a flow ratio of said alcohol gas to said oxygen gas is set to 0.5 or more, pressure in said ashing chamber is set to 200 Pa (1.5 Torr) or more, and temperature in said ashing chamber is set in the range of 200° C. to 270° C.

6. An ashing method according to claim 5, wherein said alcohol gas is a methanol gas.

7. An ashing method for ashing a wafer having an aluminum containing wiring layer etched by a chlorine containing gas, by using a plasma ashing device;

wherein said wafer is ashed under the conditions that a mixture gas composed of an oxygen gas and at least one kind of alcohol gas selected from $CH_3OH$, $C_2H_5OH$, n—$C_3H_7OH$, and i—$C_3H_7OH$ is used as an ashing gas, a flow ratio of said alcohol gas to said oxygen gas is set to 0.5 or more, pressure in an ashing chamber is set to 200 Pa (1.5 Torr) or less, and temperature in said ashing chamber is set in the range of 200° C. to 270° C.

8. An ashing method according to claim 7, wherein said alcohol gas is a methanol gas.

* * * * *